United States Patent
Brink

(10) Patent No.: US 10,524,380 B2
(45) Date of Patent: Dec. 31, 2019

(54) DEVICE COMPRISING SERVER MODULES

(71) Applicant: Aecorsis B.V., Haarlem (NL)

(72) Inventor: Dirk Roelof Brink, Haarlem (NL)

(73) Assignee: Aecorsis B.V., Haarkem (NL)

( * ) Notice: Subject to any disclaimer, the term of this patent is extended or adjusted under 35 U.S.C. 154(b) by 0 days.

(21) Appl. No.: 16/302,948

(22) PCT Filed: May 19, 2017

(86) PCT No.: PCT/EP2017/062105
§ 371 (c)(1),
(2) Date: Nov. 19, 2018

(87) PCT Pub. No.: WO2017/202717
PCT Pub. Date: Nov. 30, 2017

(65) Prior Publication Data
US 2019/0150312 A1    May 16, 2019

(30) Foreign Application Priority Data
May 23, 2016 (NL) .................................... 2016812

(51) Int. Cl.
*H01R 35/02* (2006.01)
*H05K 7/14* (2006.01)
*H05K 7/20* (2006.01)

(52) U.S. Cl.
CPC ........... *H05K 7/1491* (2013.01); *H01R 35/02* (2013.01); *H05K 7/1492* (2013.01); *H05K 7/20781* (2013.01)

(58) Field of Classification Search
CPC ... H04L 67/12; H04L 67/1097; H04L 1/0002; H01L 27/1225; H01L 29/7869; H01L 2924/00; H01L 29/66969; H01L 2223/6677; H01L 23/66; H01L 29/24; H01R 13/641; H01R 13/70; H01R 13/6675; H01R 13/7175; H01R 35/02; H05K 7/1491; H05K 7/1492; H05K 7/20781
See application file for complete search history.

(56) References Cited

U.S. PATENT DOCUMENTS

| | | | | |
|---|---|---|---|---|
| 5,339,221 A | * | 8/1994 | Conroy-Wass | H05K 7/1424 361/784 |
| 6,424,781 B1 | * | 7/2002 | Puetz | G02B 6/4452 385/135 |
| 8,925,739 B2 | * | 1/2015 | Crippen | H05K 7/1488 211/26 |
| 9,282,660 B2 | * | 3/2016 | Bailey | H05K 5/023 |

(Continued)

*Primary Examiner* — Adam B Dravininkas
(74) *Attorney, Agent, or Firm* — Marcus C. Dawes

(57) ABSTRACT

Device (1) comprising a multitude of server modules (3). The server modules (3) are removable, are substantially plate shaped and extend parallel to each other. Each one of the server modules (3) is connected to cable passages (61a) of a first switch (4) by first data cables (6a) and to cable passages (61b) of a second switch (4) by second data cables (6b. The first switch (4) extends perpendicular to and adjacent an edge of the server modules (3) The cable passages (61a) of said first switch (4) extend in a first array and the cable passages (61b) of said second switch (4) extend in a second array. The second array of cable passages (61b) is mounted on a bracket (7) which is mounted on the second switch (4). The bracket (7) extends at a distance from the second switch (4) and from the first array.

11 Claims, 8 Drawing Sheets

(56) References Cited

U.S. PATENT DOCUMENTS

| | | | |
|---|---|---|---|
| 2003/0112582 A1* | 6/2003 | Sanders | H05K 7/1492 361/600 |
| 2008/0112152 A1* | 5/2008 | Figueroa | H02G 3/30 361/826 |
| 2008/0320117 A1* | 12/2008 | Johnsen | G06F 11/30 709/221 |
| 2009/0166178 A1* | 7/2009 | Harmon | A61L 2/0011 204/158.21 |
| 2012/0224313 A1* | 9/2012 | Hu | H05K 7/1489 361/679.4 |
| 2013/0120941 A1* | 5/2013 | Peterson | H05K 7/1492 361/724 |
| 2014/0153187 A1* | 6/2014 | Liu | H02G 3/32 361/679.58 |
| 2015/0327381 A1* | 11/2015 | Alshinnawi | H05K 7/1492 361/679.02 |

* cited by examiner

DEVICE COMPRISING SERVER MODULES

The invention relates to a device comprising server modules. In particular, but not exclusively, the invention relates to a device wherein said server modules are submerged in a cooling liquid, such as oil.

Server units, which for instance can be found in datacentres, are preferably as compact as possible. But the components of these server units also need to be serviced and/or replaced from time to time, which can be difficult and time consuming if the units are very compact. Furthermore, in order to provide a reliable system, extra components are preferably provided in redundancy, which adds however of the complexity of the device's layout and thereby of the maintenance. The invention aims at an efficient, space saving, redundant, and/or easy maintenance solution for datacentre components.

To that end the server modules are removable, are substantially plate shaped and extend parallel to each other, wherein each one of said server modules is connected to cable passages of a first switch by first data cables and to cable passages of a second switch by second data cables, wherein said first and second switches are removable, are shaped substantially as a flat box and extend parallel to and adjacent each other, and said first switch extends perpendicular to and adjacent an edge of said server modules, wherein said cable passages of said first switch extend in a first array and the cable passages of said second switch extend in a second array, wherein said first and second arrays extend parallel to each other, and wherein said first array of cable passages extends near an edge of said first switch and near said edge of said server modules, and wherein said second array of cable passages is mounted on a bracket which is mounted on said second switch, said bracket extending at a distance from the second switch and from said first array.

In the preferred embodiment said device comprises a second set of server modules, wherein said server modules are also removable, are also substantially plate shaped and extend parallel to each other on the other side of said switches opposite the first set comprising the aforementioned server modules, wherein each one of said server modules of said second set is connected to cable passages of said second switch by first data cables and to cable passages of said first switch by second data cables, wherein said second switch extends perpendicular to and adjacent an edge of said server modules of said second set, wherein said cable passages of said second switch extend in a third array and the cable passages of said first switch extend in a fourth array, wherein said first, second, third and fourth arrays extend parallel to each other, and wherein said third array of cable passages extends near an edge of said second switch and near said edge of said server modules of said second set, and wherein said fourth array of cable passages is mounted on a bracket which is mounted on said first switch, said bracket extending at a distance from the first switch and from said third array.

Preferably said brackets are mounted on said switches in such a manner that the brackets can be moved between a first position wherein they block the removal of the adjacent switch and a second position wherein they allow removal of the said adjacent switch. In the preferred embodiment said bracket blocks removal of the server modules adjacent said adjacent switch in said second position. Said brackets are preferably hingeably mounted on said switches by means of a hingeable link connected to a hinge shaft.

Said server modules are furthermore preferably each connected to cable passages of a power distribution unit, said power distribution unit extending at the edges of said server modules opposite said switches. Said server modules are preferably each connected to cable passages of a second power distribution unit, said second power distribution unit extending parallel to and adjacent the first aforementioned power distribution unit.

Thus, in the preferred embodiment said components of the device are arranged mirror symmetrical relative to a plane extending between said switches. By the arrangement of the invention a compact, but yet easily maintainable configuration is obtained.

The invention will now be elucidated by means of a description of preferred embodiments with reference to the drawings, in which:

FIG. 1 is a schematic top view of a first embodiment of a device comprising server modules;

FIGS. 2A/B, 3A/B, 4A/B and 5A/B are schematic top views of a second embodiment of a device comprising server modules;

Figure 1:
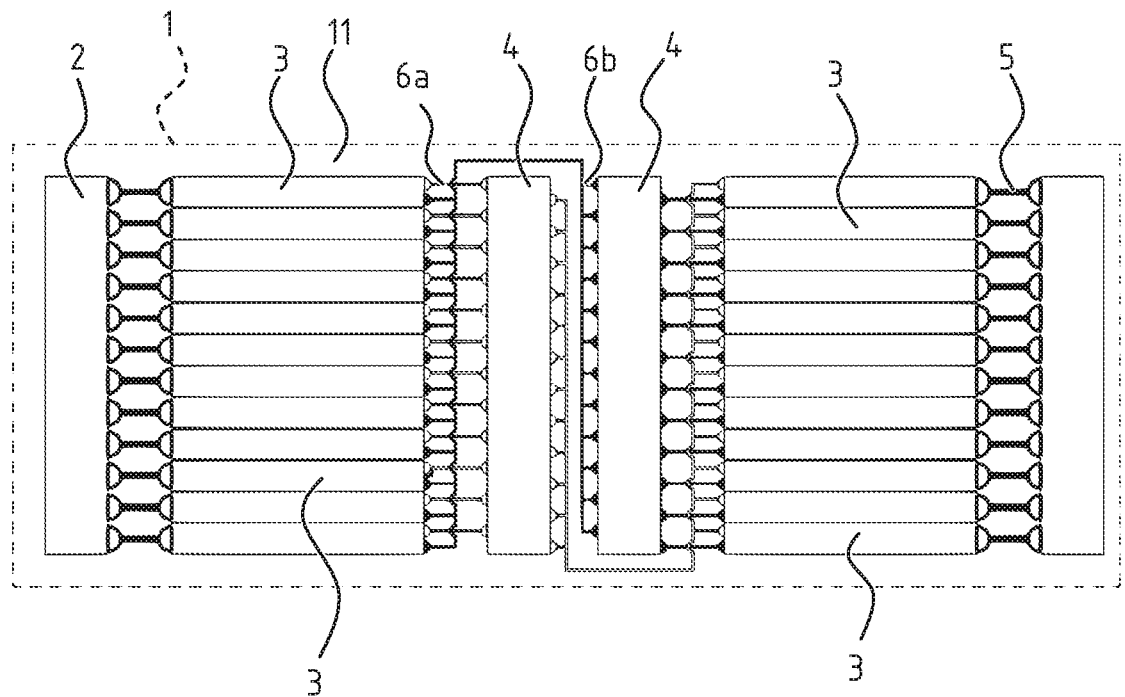

With reference to FIG. 1, the device 1 includes power distribution units 2, server modules 3, switches 4, power cables 5 and data cables 6. The power distribution units 2 are placed on the outer ends of the layout. In the middle, parallel to the power distribution units 2, the switches 4 are placed. On each side, between the power distribution units 2 and the switches 4 the server modules 3 are placed perpendicular to both the power distribution units 2 and the switches 4. The server modules 3 are submerged in a cooling liquid 11, such as oil.

Each server module 3 is placed at the exact same distance to its power feeding power distribution units 2 since they are positioned side by side perpendicular to the power distribution units 2. This allows for power cables 5 of the exact same length connecting every server module 3 to the nearest power distribution unit 2. For power redundancy, two power distribution units 2 may be placed on top of each other, such that each server module 3 can be connected to two power distribution units 2 by two power cables 5.

The switches 4 are positioned side by side in the middle of the device 1. Each server module 3 is connected to connectors, which are comprised of cable passages which are comprised in cable passages 61a, 61b, on both the switches 4 by data cables 6a, 6b. The connection between the server modules 3 and the nearest switch 4 is direct by one or more data cables 6a. This allows for data cables 6a of the exact same length connecting every server module 3 to the nearest switch 4. The data cables 6b between the server modules 3 and the other switch 4 are routed around the nearest switch 4. By connecting the first server module 3 to the last port of the other switch 4, the second server module 3 to the second last port of the other switch 4, up to the last server module 3 to the first port of the other switch 4, it allows for data cables 6b of the exact same length connecting every server module 3 to the other switch 4.

To use all space available, the power distribution units 2 should be as close as possible to the server modules 3 and the server models 3 should be as close as possible to the switches 4. Hereby the cables 5, 6a, 6b will obstruct the server modules 3 and the switches 4 from being able to remove and replace them.

The power cables 5 will obstruct the server module 3. By disconnecting the power cables 5 for one server module 3, that server module 3 is not powered anymore and the power cables 5 do not obstruct the server module 3. The data cables 6b can be routed either over the server modules 3 or over the switches 4.

Figure 2A:
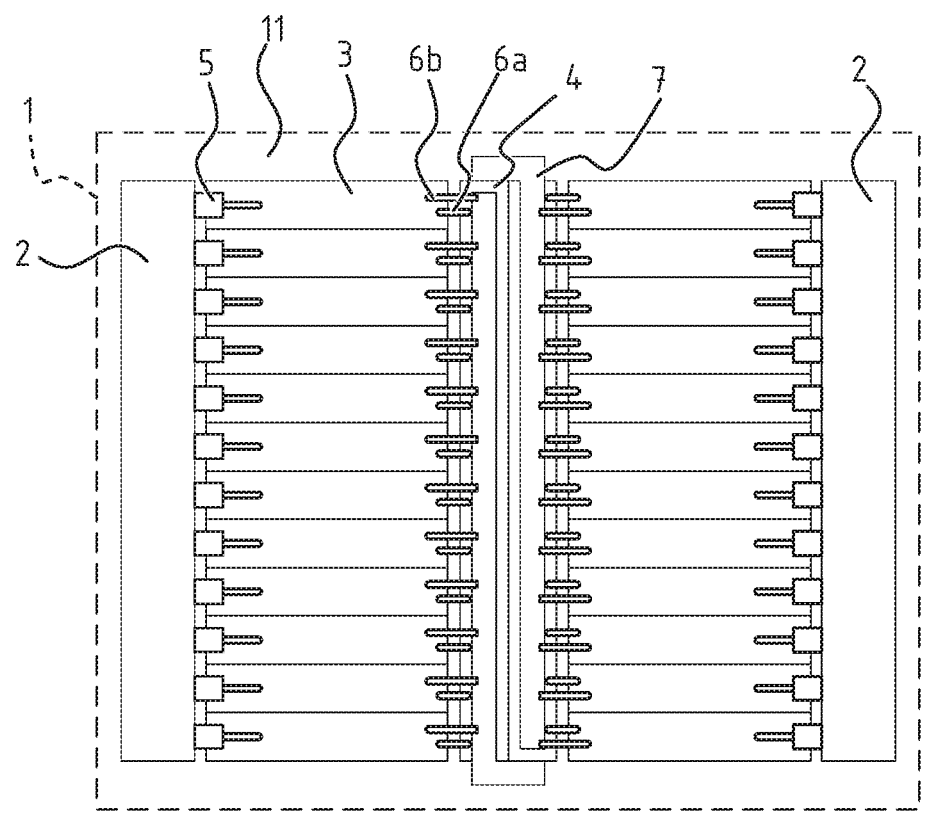
Figure 2B:
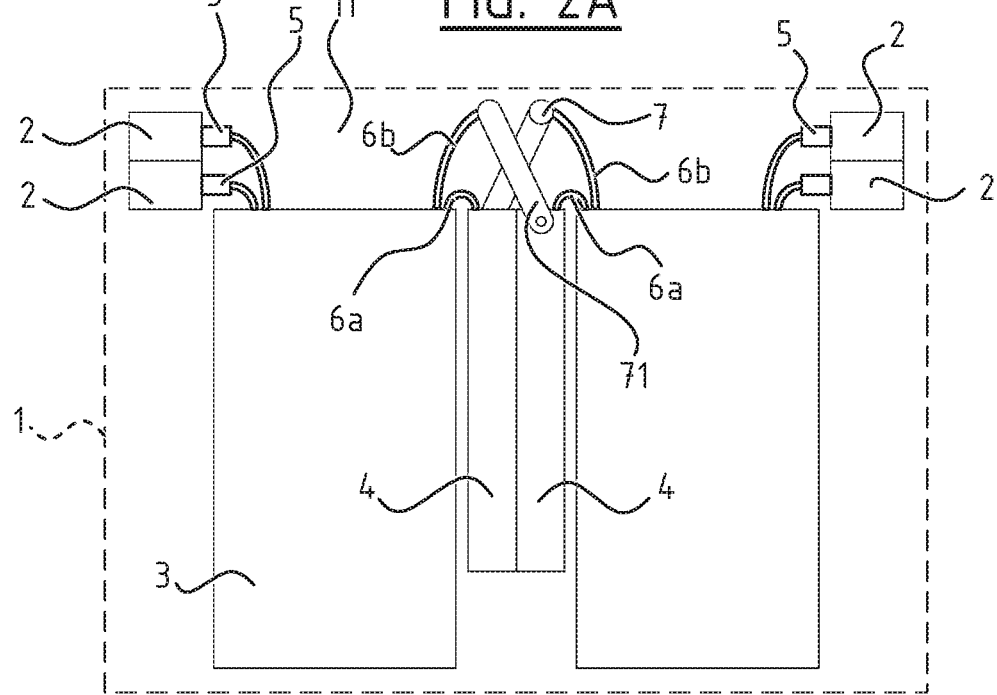

With reference to FIGS. 2A/B, 6, 7 and 8, to avoid this problem a switch data cable bracket 7 is introduced, which holds connectors which are comprised of cable passages 61b. Instead of being connected to connectors (which allows for releasing said cables 6a, 6b at that end), cables 6a, 6b can also extend into the switch via the cable passages 61a, 61b on the data cable bracket 7 in the form of through holes at the shown locations. The brackets 7 are hingeably mounted on the switches 4 by means of a hingeable link 71 connected to a hinge shaft 72. This switch data cable bracket 7 can be rotated such that either the server modules 3 are obstructed or one of the switches 4 is obstructed. See FIGS. 2A/B for the position where the switches 4 are obstructed and FIGS. 5A/B for the position where a switch 4 can be removed.

Figure 3A:
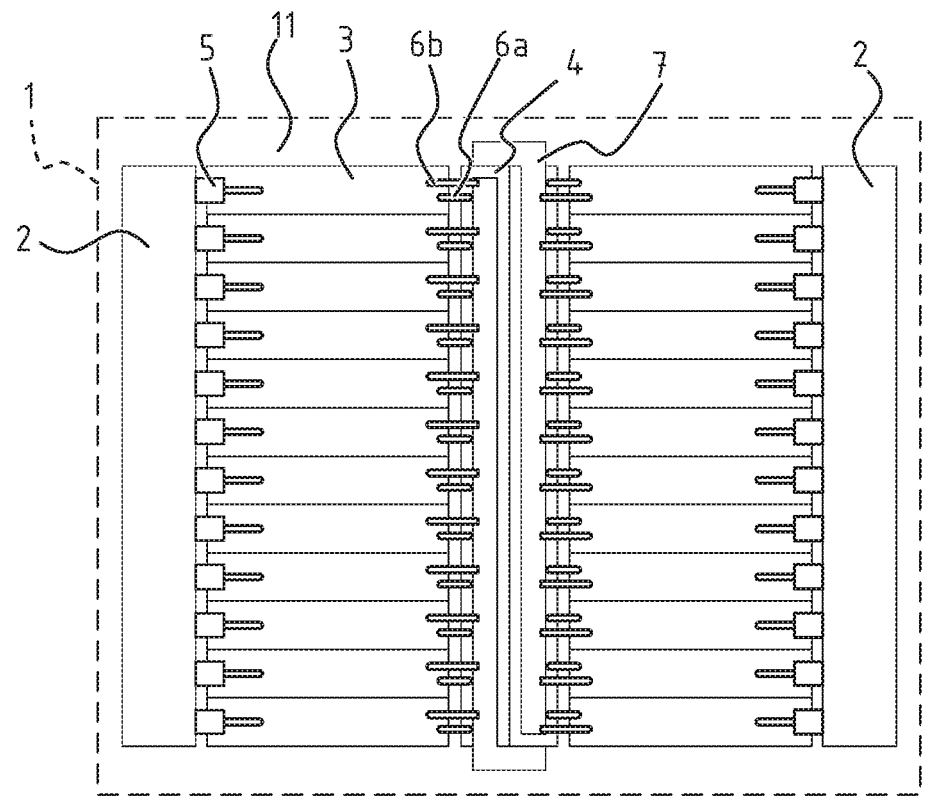
Figure 3B:
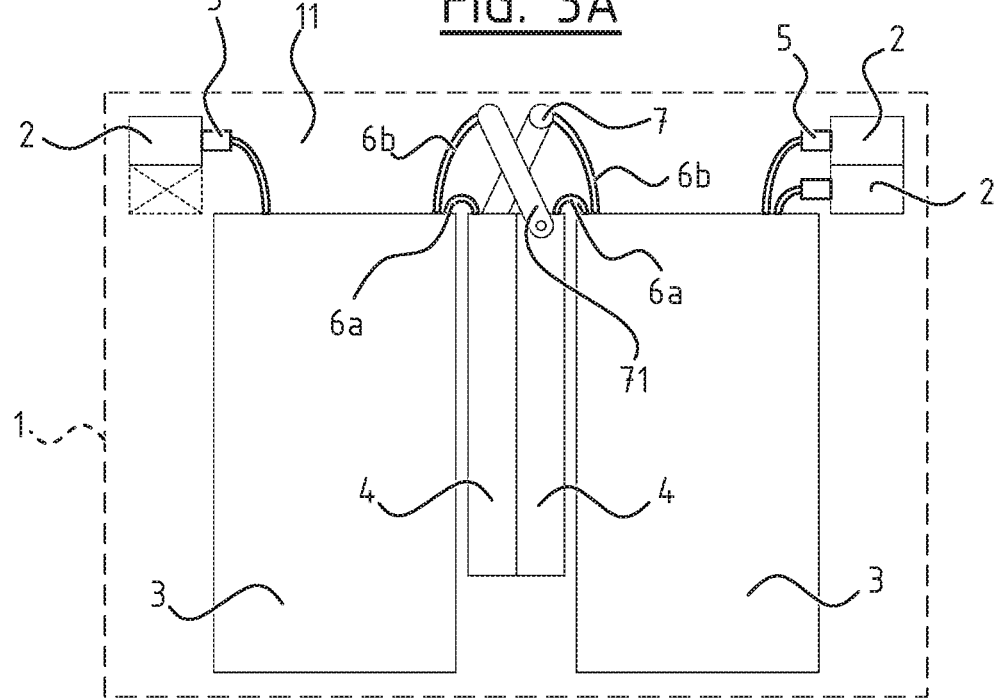

With reference to FIGS. 3A/B, two power distribution units 2 can be placed on both sides of the layout leading to a total of four power distribution units 2 for redundancy, if required. The power distribution units 2 are placed on top of each other. For maintenance of a redundant power distribution unit 2, all power cables 5 have to be disconnected. When disconnected all server modules 3 remain operational as they receive power from the other power distribution unit 2. Thereby the disconnected power distribution unit 2 can be removed and replaced easily.

Figure 4A:
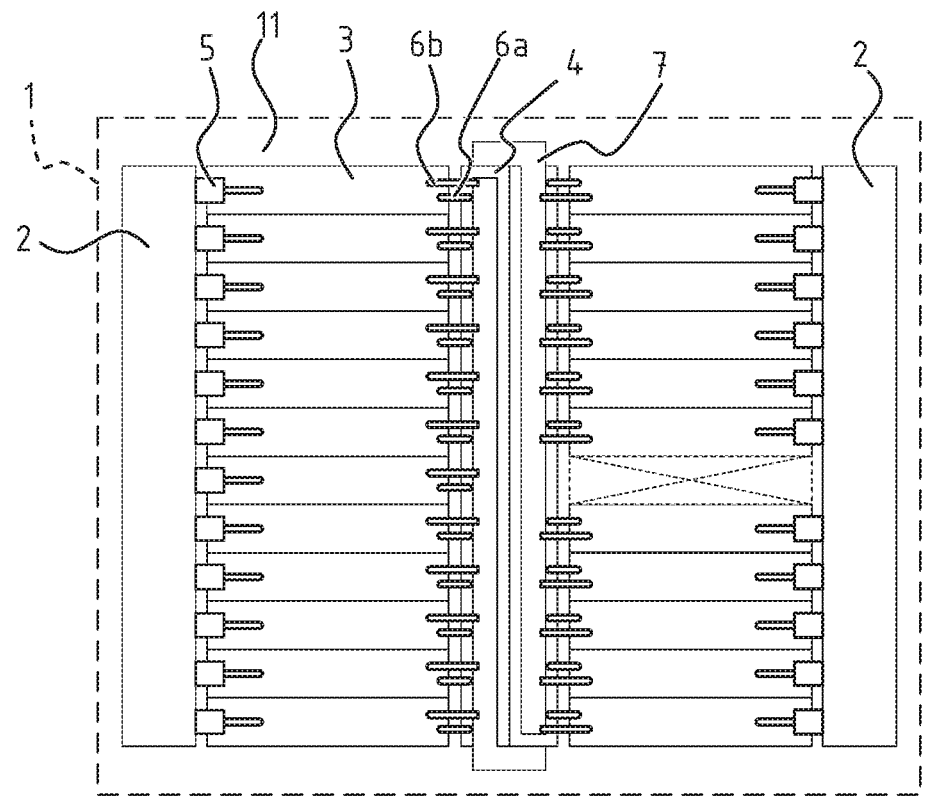
Figure 4B:
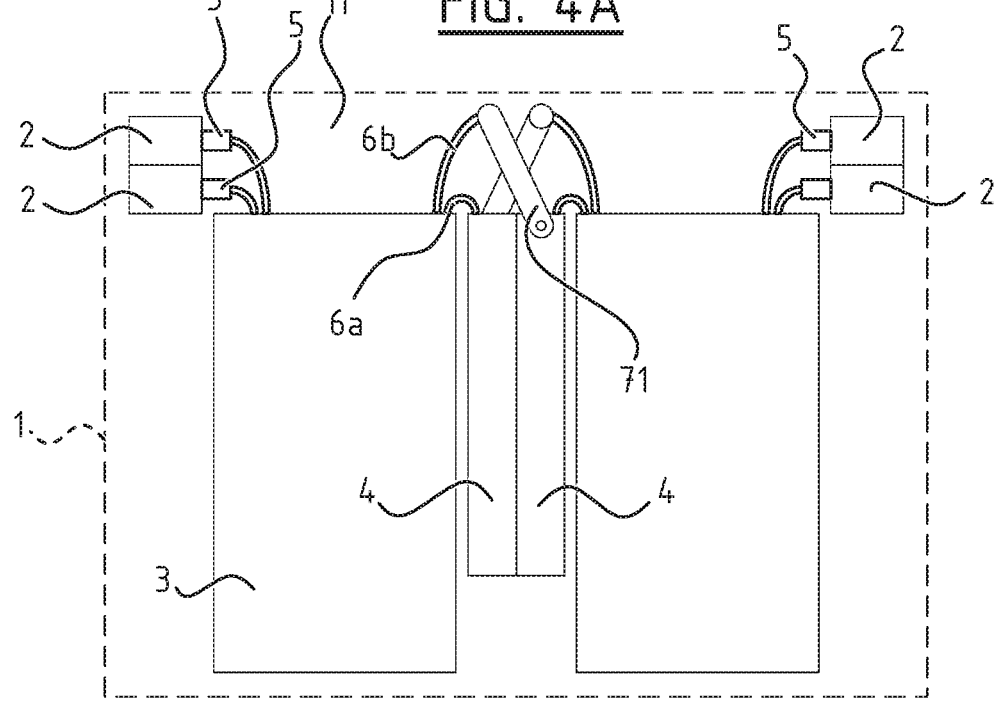

With reference to FIGS. 4A/B, for maintenance of a server module 3 all its connected power cables 5 and data cables 6a, 6b have to be disconnected. All other server modules remain connected and operational. Since there are no other cables obstructing the removal of the server module 3, the server module 3 can be easily removed and replaced.

Figure 5A:
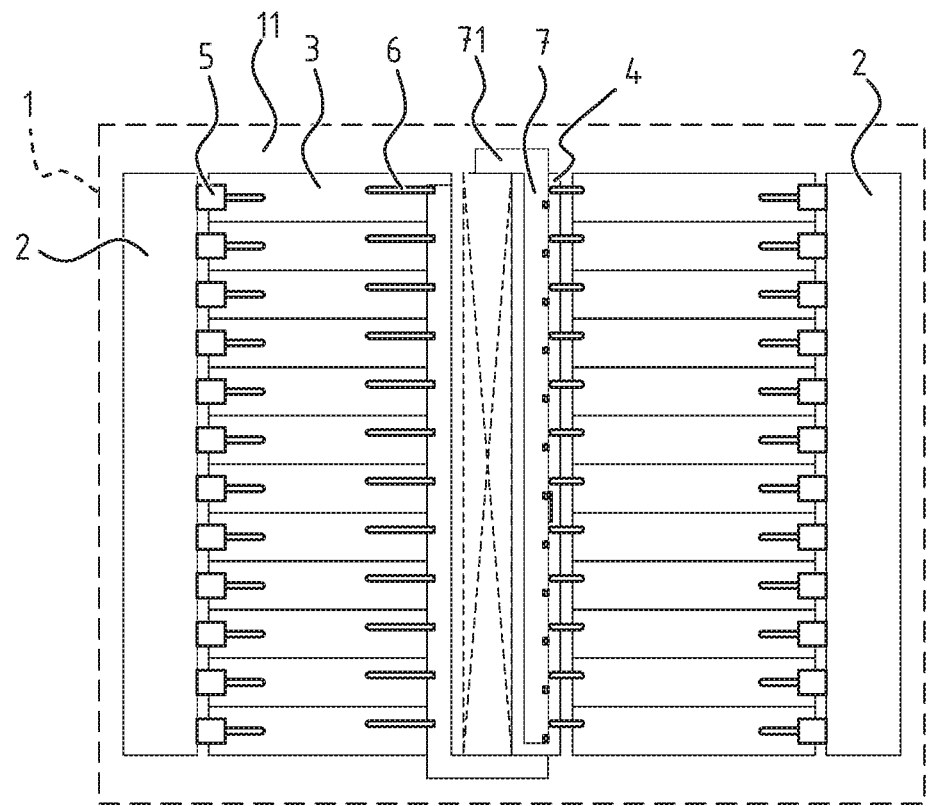
Figure 5B:
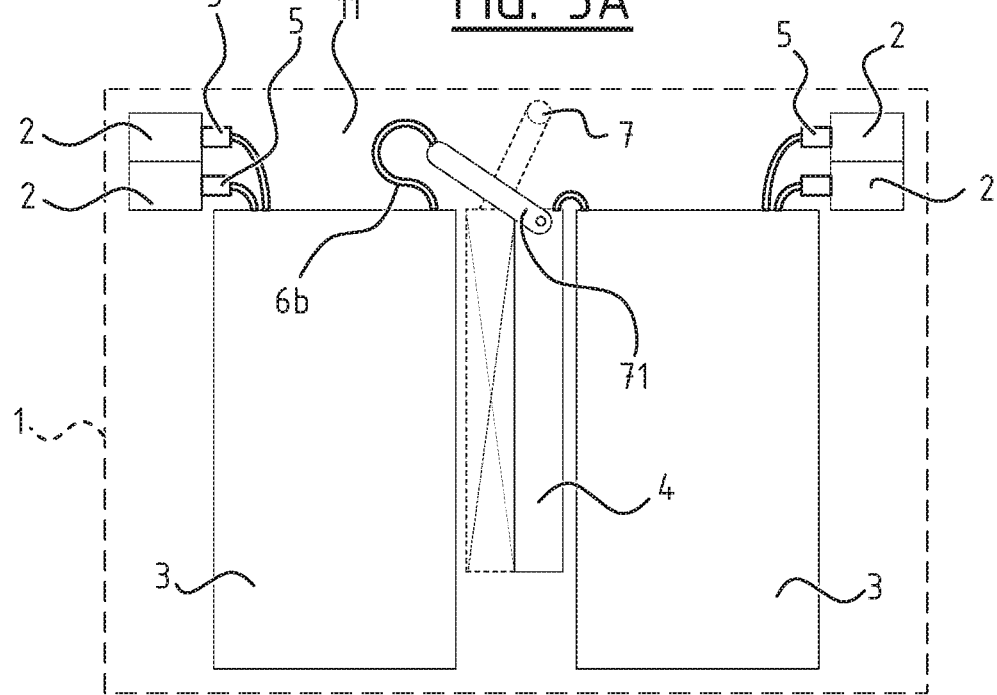
Figure 6:
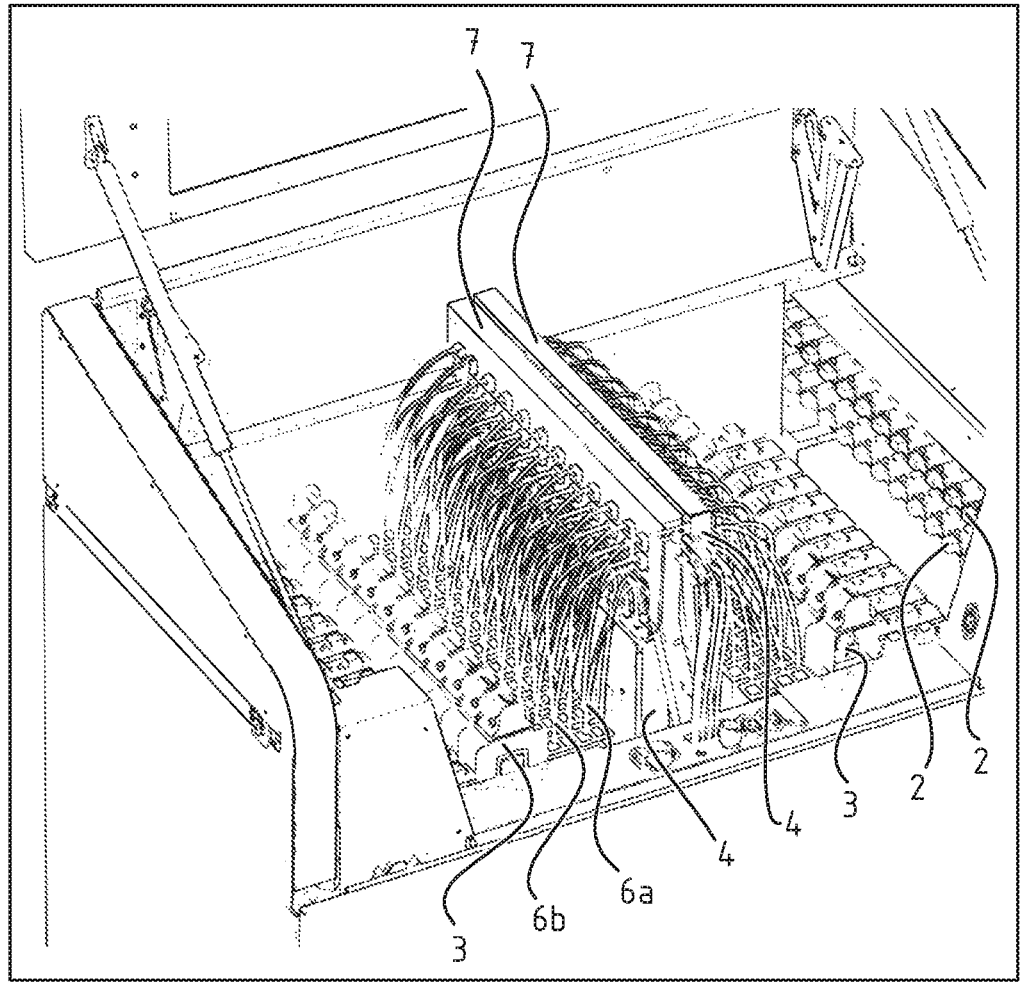
FIG. 6 is a perspective view of the device of FIGS. 2-5.
Figure 7:
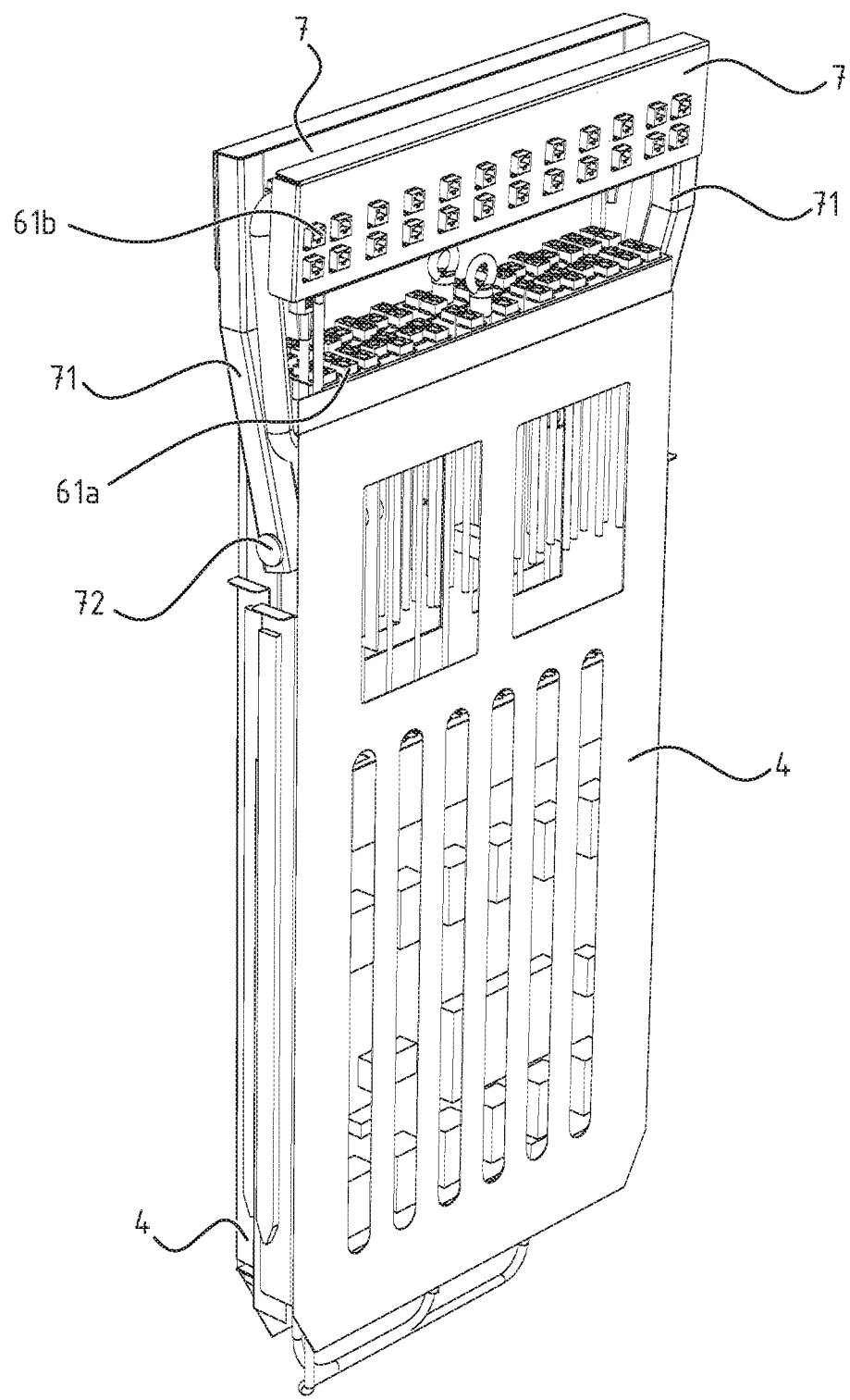
FIGS. 7 and 8 are perspective views of a double switch used in the device of FIGS. 2-6.
Figure 8:
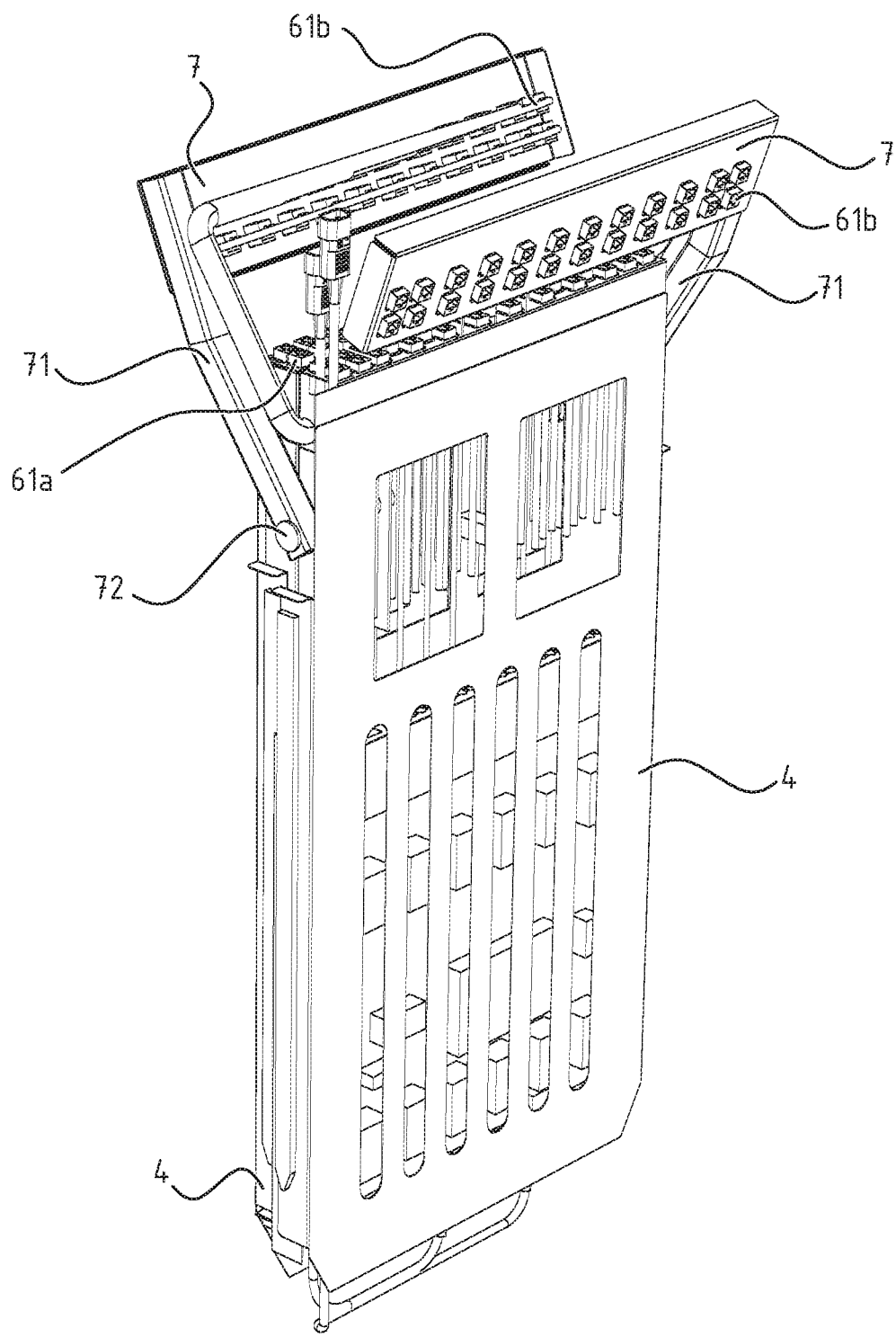

With reference to FIGS. 5A/B, for maintenance of a switch 4 all data cables 6a, 6b have to be disconnected. When disconnected all server modules 3 remain operational as they have one or more data connections with the other switch 4. In case a switch data cable bracket 7 is used it needs to be rotated down. Since there is nothing obstructing the removal of the switch 4, the switch 4 can be easily removed and replaced.

The invention has thus been described by means of preferred embodiments. It is to be understood, however, that this disclosure is merely illustrative. Various details of the structure and function were presented, but changes made therein, to the full extent extended by the general meaning of the terms in which the appended claims are expressed, are understood to be within the principle of the present invention. The description and drawings shall be used to interpret the claims. The claims should not be interpreted as meaning that the extent of the protection sought is to be understood as that defined by the strict, literal meaning of the wording used in the claims, the description and drawings being employed only for the purpose of resolving an ambiguity found in the claims. For the purpose of determining the extent of protection sought by the claims, due account shall be taken of any element which is equivalent to an element specified therein.

The invention claimed is:

1. A device comprising a multitude of server modules, wherein said server modules are removable, are substantially plate shaped and extend parallel to each other,
wherein each one of said server modules is connected to cable passages of a first switch by first data cables and to cable passages of a second switch by second data cables,
wherein said first and second switches are removable, are shaped substantially as a flat box and extend parallel to and adjacent each other, and said first switch extends perpendicular to and adjacent an edge of said server modules,
wherein said cable passages of said first switch extend in a first array and the cable passages of said second switch extend in a second array, wherein said first and second arrays extend parallel to each other, and
wherein said first array of cable passages extends near an edge of said first switch and near said edge of said server modules, and wherein said second array of cable passages is mounted on a bracket which is mounted on said second switch, said bracket extending at a distance from the second switch and from said first array.

2. The device in accordance to claim 1, wherein said device comprises a second set of server modules, wherein said server modules are also removable, are also substantially plate shaped and extend parallel to each other on the other side of said switches opposite the first set comprising the aforementioned server modules,
wherein each one of said server modules of said second set is connected to cable passages of said second switch by first data cables and to cable passages of said first switch by second data cables,
wherein said second switch extends perpendicular to and adjacent an edge of said server modules of said second set,
wherein said cable passages of said second switch extend in a third array and the cable passages of said first switch extend in a fourth array, wherein said first, second, third and fourth arrays extend parallel to each other, and
wherein said third array of cable passages extends near an edge of said second switch and near said edge of said server modules of said second set, and
wherein said fourth array of cable passages is mounted on a bracket which is mounted on said first switch, said bracket extending at a distance from the first switch and from said third array.

3. The device in accordance to claim 1, wherein said brackets are mounted on said switches in such a manner that the brackets can be moved between a first position wherein they block the removal of the adjacent switch and a second position wherein they allow removal of the said adjacent switch.

4. The device in accordance to claim 3, wherein said bracket blocks removal of the server modules adjacent said adjacent switch in said second position.

5. The device in accordance to claim 3, wherein said brackets are hingeably mounted on said switches by means of a hingeable link connected to a hinge shaft.

6. The device in accordance to claim 1, wherein said server modules are each connected to cable passages of a power distribution unit, said power distribution unit extending at the edges of said server modules opposite said switches.

7. The device in accordance to claim 6, wherein said server modules are each connected to cable passages of a second power distribution unit, said second power distribution unit extending parallel to and adjacent the first aforementioned power distribution unit.

8. The device in accordance to claim 1, wherein said components of the device are arranged mirror symmetrical relative to a plane extending between said switches.

9. The device in accordance to claim 1, wherein said server modules are submerged in a cooling liquid, such as oil.

10. The device in accordance to claim 1, wherein said cable passages comprise cable connectors, for connecting and disconnecting said cables.

11. The device in accordance to claim 9, wherein the cooling liquid is oil.

* * * * *